US006680992B1

(12) United States Patent
Morikawa et al.

(10) Patent No.: US 6,680,992 B1
(45) Date of Patent: Jan. 20, 2004

(54) CLOCK IDENTIFICATION AND REPRODUCTION CIRCUIT

(75) Inventors: Takenori Morikawa, Tokyo (JP); Masaaki Soda, Tokyo (JP); Satomi Shioiri, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/383,099

(22) Filed: Aug. 25, 1999

(30) Foreign Application Priority Data

Aug. 26, 1998 (JP) .......................................... 10-240501

(51) Int. Cl.$^7$ ................................................ H03D 3/24
(52) U.S. Cl. ...................... 375/376; 375/294; 375/328; 327/159; 713/500
(58) Field of Search ................................ 375/293, 294, 375/324, 327, 328, 354, 355, 373, 374, 375, 376; 327/141, 146, 147, 150, 155, 159, 162, 163; 331/1 A, 1 R, 18, 25; 370/503, 516; 713/400, 401, 500, 503, 600; 438/297; 326/110

(56) References Cited

U.S. PATENT DOCUMENTS

| 4,527,277 A | * | 7/1985 | Kosaka et al. ............... 375/328 |
| 4,808,850 A | * | 2/1989 | Masuda et al. .............. 326/110 |
| 5,027,085 A | * | 6/1991 | DeVito ........................ 331/1 A |
| 5,185,584 A | * | 2/1993 | Takeuchi ...................... 331/25 |
| 5,470,770 A | * | 11/1995 | Takahashi et al. .......... 438/297 |
| 6,314,151 B1 | * | 11/2001 | Fukaishi ..................... 375/376 |
| 6,421,404 B1 | * | 7/2002 | Nakamura ................... 375/354 |

FOREIGN PATENT DOCUMENTS

| JP | 58-182938 | 10/1983 |
| JP | 64-27317 | 1/1989 |
| JP | 64-27336 | 1/1989 |
| JP | 9-64859 | 3/1997 |
| JP | 11-122232 | 4/1999 |
| JP | 2000-40957 | 2/2000 |

OTHER PUBLICATIONS

Japanese Office Action issued Feb. 28, 2001 in a related application with English translation of the relevant portions.
"A Self–Correcting Clock Recovery Circuit," Journal of Lightwave Technology, IEEE/OSA, vol. LT–3, No. 6, 1985, pp. 1312–1314. (Previously made of record.) Paper #3.
"A Self Correcting Clock Recovery Circuit," Journal of Lightwave Tech., vol. LT–3, No. 6, 1985, pp. 1312–1314, Charles R. Hogge, Jr.

* cited by examiner

*Primary Examiner*—Chieh M. Fan
(74) *Attorney, Agent, or Firm*—Dickstein, Shapiro, Morin & Oshinsky, LLP.

(57) ABSTRACT

A clock identification and reproduction circuit which synchronizes a clock signal with an input signal includes a voltage controlled generator for generating a clock signal, a phase comparator for detecting a phase difference between an input signal and a clock signal to generate a phase difference signal according to the phase difference, and a filter for synchronizing a clock signal of the voltage controlled generator in response to a phase difference signal, in which the phase comparator generates a phase difference signal when a specific pulse waveform of a pulse of an input signal changes.

7 Claims, 12 Drawing Sheets

CLOCK IDENTIFICATION AND REPRODUCTION CIRCUIT

BACKGROUNDS OF THE INVENTION

1. Field of the Invention

The present invention relates to a clock identification and reproduction circuit and, more particularly, to a clock identification and reproduction circuit for reproducing a clock signal from a high-speed NRZ signal.

2. Description of the Related Art

Used as a signal for high-speed communication such as optical communication is an NRZ signal, in which a data signal contains no clock signal component in general. A reception IC therefore requires a clock identification and reproduction circuit which not only amplifies a data signal but also identifies a clock signal synchronizing with a data signal to reproduce a clock signal within the circuit.

Figure 9:
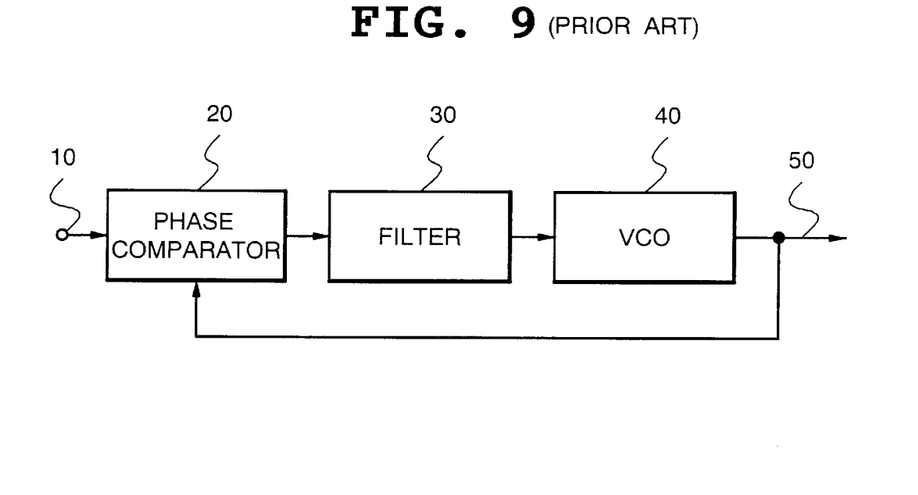
FIG. 9 is a block diagram showing structure of a clock identification and reproduction circuit according to the present invention and conventional art.

FIG. 9 is a block diagram showing structure of a clock identification and reproduction circuit according to the present invention and conventional art.

With reference to FIG. 9, the clock identification and reproduction circuit includes a feedback loop composed of a phase comparator 20, a filter 30 and a VCO (voltage controlled oscillator) 40.

The phase comparator 20 compares a phase of a data signal from an input terminal 10 and that of a clock signal of the VCO 40 to generate an output voltage according to a phase difference. Then, after the filter 30 limits a bandwidth of the output voltage, the output voltage is fed back as a voltage for controlling a clock signal of the VCO 40. By this feedback loop, a clock signal of the VCO 40 synchronizing with a data signal can be obtained.

Known as a conventional example of such a clock identification and reproduction circuit is the circuit structure invented by C. R. Hogge, Jr. (see C. R. Hogge, Jr., "A Self Correcting Clock Recovery Circuit", Journal of Lightwave Tech., Vol. LT-3, No. 6, 1985, P1312).

Figure 10:
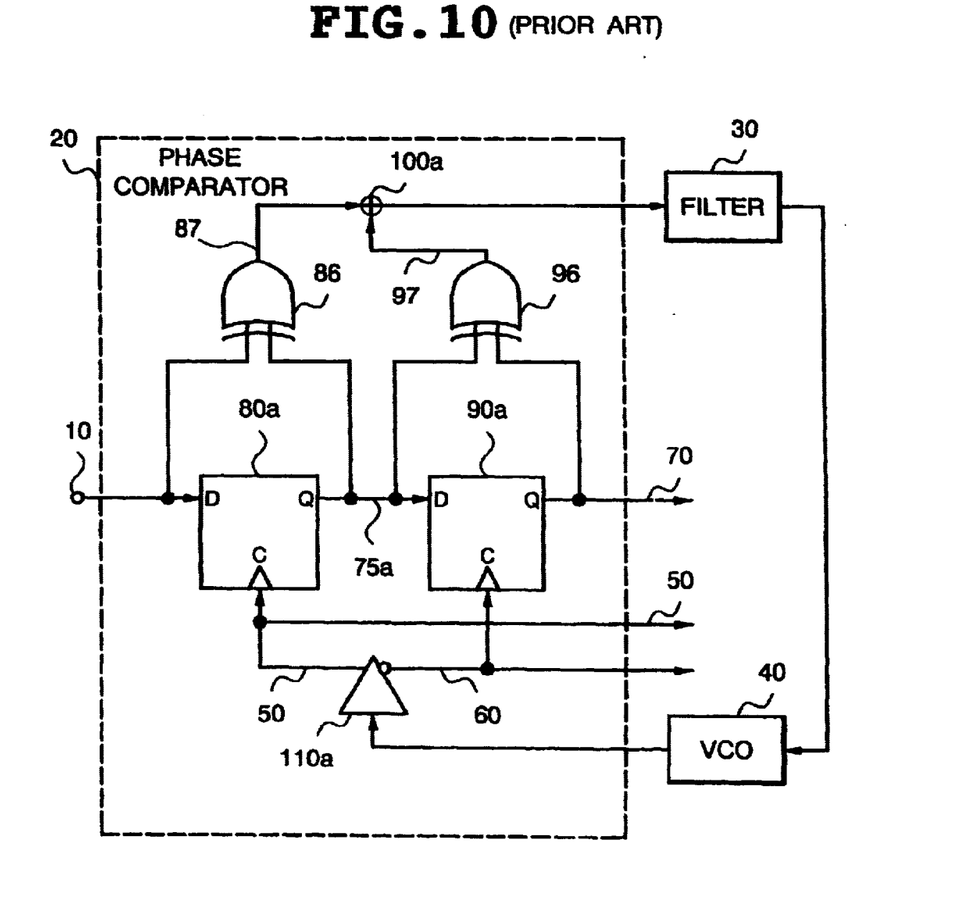
FIG. 10 is a block diagram showing circuit structure of a clock identification and reproduction circuit according to conventional art.

FIG. 10 is a block diagram showing circuit structure of the conventional clock identification and reproduction circuit invented by C. R. Hogge, Jr.

In the following, operation of the circuit will be described.

A data signal is applied from an input terminal 10 to a first D-type flip-flop 80a and output from the first D-type flip-flop 80a with a clock signal of a VCO 40 as a latch timing clock.

The input terminal 10 and a first D-type flip-flop output terminal 75a are connected to a first EXOR gate 86 and an EXOR signal of the applied data signal and the output of the first D-type flip-flop 80a is output to a first EXOR gate output terminal 87.

Accordingly, an output pulse width of this EXOR signal will vary according to a difference in phase between the clock signal of the VCO 40 and the data signal and be used as a comparison pulse signal.

In addition, the output of the first D-type flip-flop 80a is applied through the first D-type flip-flop output terminal 75a to a second D-type flip-flop 90a and output from the second D-type flip-flop 90a to a data output terminal 70 with an inversion of the clock signal of the VCO 40 as a latch timing clock.

The first D-type flip-flop output terminal 75a and the data output terminal 70 are connected to a second EXOR gate 96 and an EXOR signal of the output of the first D-type flip-flop 80a and the output of the second D-type flip-flop 90a is output to a second EXOR gate output terminal 97.

Since this output signal constantly has a fixed pulse width regardless of a phase difference of a clock signal from that of a data signal, the output signal will be used as a reference pulse signal.

Accordingly, comparison with a comparison pulse signal results in quantitatively finding a phase difference.

Figure 11:
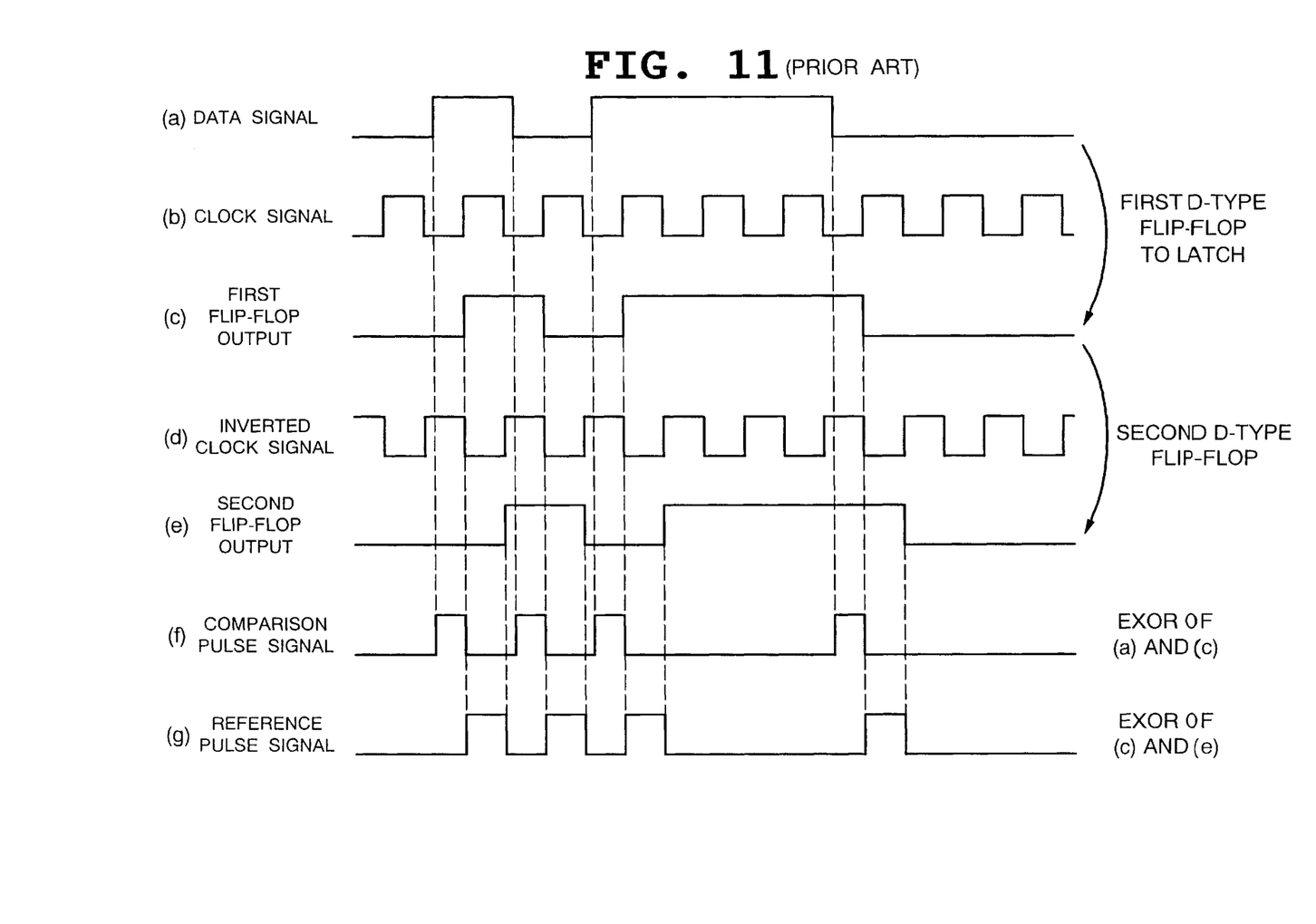
FIG. 11 is a timing chart for use in explaining processing with respect to each signal of the clock identification and reproduction circuit according to conventional art at a state where a phase of a clock signal leads over that of a data signal.
Figure 12:
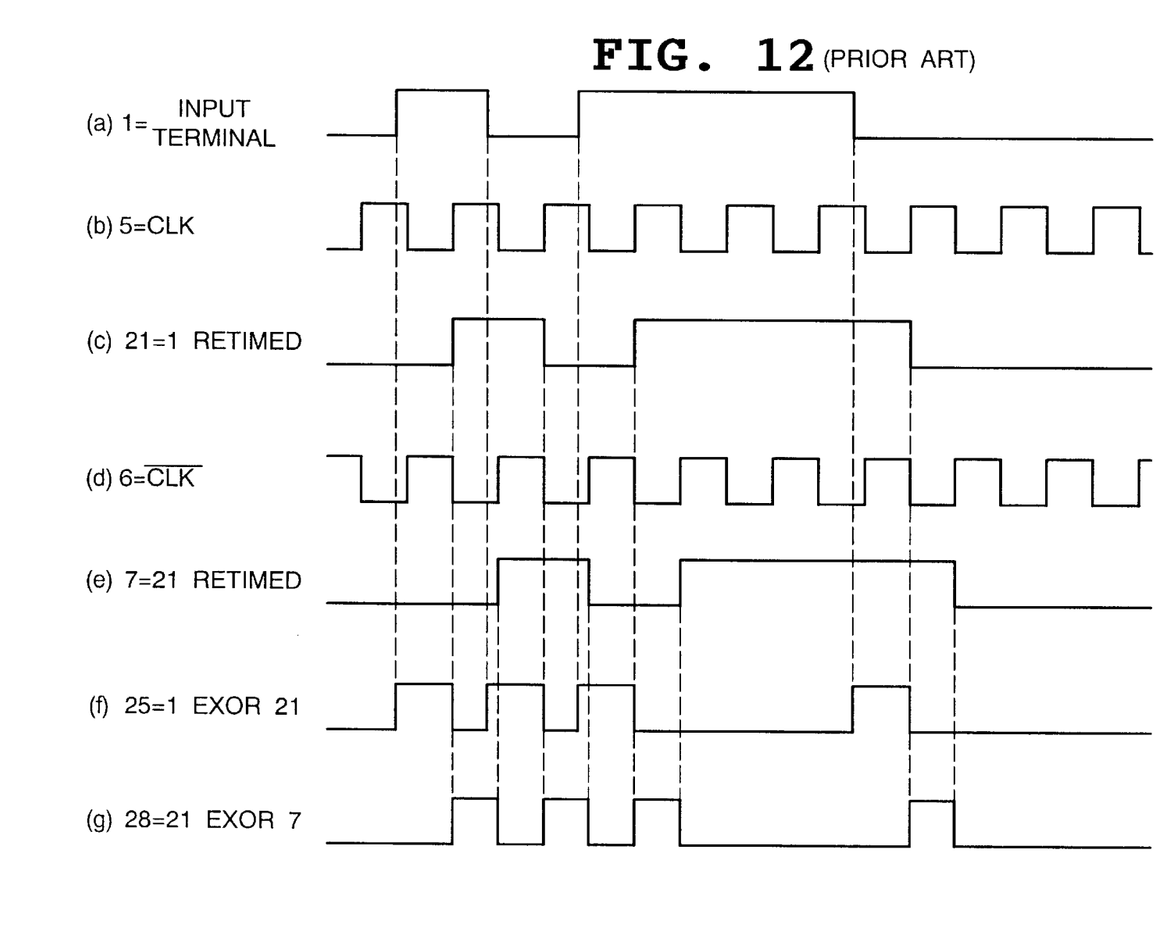
FIG. 12 is a timing chart for use in explaining processing with respect to each signal of the clock identification and reproduction circuit according to conventional art at a state where a phase of a clock signal lags behind that of a data signal.

FIGS. 11 and 12 are timing charts for use in explaining processing with respect to each signal of the clock identification and reproduction circuit according to conventional art.

In the processing with respect to each signal of this clock identification and reproduction circuit according to conventional art, a data signal (a) applied through the input terminal 10 is latched by a clock signal (b) to obtain a comparison pulse signal (c) from the data signal (a) and the latched output (c).

In addition, the latched output (c) is again latched (e) by an inverted clock signal (d) to obtain a reference pulse signal (g).

FIG. 11 is for use in explaining the processing executed when a phase of a clock signal leads over that of a data signal. In this case, a comparison pulse signal (f) is generated whose width is smaller than a half cycle of a clock.

On the other hand, FIG. 12 is for use in explaining the processing executed when a phase of a clock signal lags behind that of a data signal. In this case, a comparison pulse signal (f) is generated whose width is larger than a half cycle of a clock.

Accordingly, after applying the comparison pulse signal (f) and the reference pulse signal (g) to an adder 100a to conduct addition (subtraction), by removing a high-frequency signal component by the filter 30, the signal can be converted into an input voltage for controlling a clock signal of the VCO 40. Thus structured feedback loop enables reproduction of a clock signal synchronizing with a data signal.

Since in the conventional clock identification and reproduction circuit shown in FIG. 10, the more the phase of a clock signal of the VCO 40 leads over that of an input data signal, the smaller a width of a comparison pulse signal generated at the first EXOR gate output terminal 87 becomes as illustrated in FIG. 11 (f), the first EXOR gate 86 requires to have a fast enough response.

In addition, as the clock signal has its phase more lagging behind that of the data signal as illustrated in FIG. 12, the interval of the comparison pulse signal (f) becomes shorter and shorter. Also in this case, if a response speed of the EXOR circuit is not high enough, waveforms might interfere with each other due to a drop of waveforms, making quantitative discrimination of a phase difference impossible.

Therefore, when a response speed of the EXOR circuit is not sufficient, a margin of a latch timing of a high-speed data signal will become narrow to make clock identification and reproduction difficult and degrade reliability of circuit operation. Another problem is the reduction in the flexibility of circuit design.

SUMMARY OF THE INVENTION

A first object of the present invention is to provide a clock identification and reproduction circuit including a phase comparison circuit capable of quantitatively obtaining a phase difference between a data signal and a clock signal without requiring high-speediness of the circuit.

A second object of the present invention is to provide a clock identification and reproduction circuit which is capable of conducting highly reliable clock identification without a possibility of interference of a waveform due to a latch timing and whose flexibility of circuit design is high.

According to the first aspect of the invention, a clock identification and reproduction circuit which synchronizes a clock signal with an input signal, comprises a voltage controlled generator for generating the clock signal, a phase comparator for detecting a phase difference between the input signal and the clock signal to generate a phase difference signal according to the phase difference, and a filter for synchronizing a phase of the clock signal of the voltage controlled generator in response to the phase difference signal, wherein the phase comparator generates the phase difference signal when a specific pulse waveform of a pulse of the input signal changes.

In the preferred construction, the phase comparator generates the phase difference signal when the pulse waveform of the input signal changes from "0" to "1".

In another preferred construction, the phase comparator comprises a first D-type flip-flop circuit for latching and outputting the input signal with the clock signal as a latch timing, a second D-type flip-flop circuit for latching and outputting the output from the first D-type flip-flop circuit with an inversion of the clock signal as a latch timing, a first logical product gate for outputting a logical product of the input signal and an inverted output from the first D-type flip-flop circuit as a comparison pulse signal, and a second logical product gate for outputting a logical product of the output from the first D-type flip-flop circuit and an inverted output from the second D-type flip-flop circuit as a reference pulse signal.

In another preferred construction, a bipolar transistor is used as a circuit element, and an MOSFET is used as a circuit element.

According to the second aspect of the invention, a clock identification and reproduction circuit which synchronizes a clock signal with an input signal, comprises a voltage controlled generator for generating the clock signal, a phase comparator for detecting a phase difference between the input signal and the clock signal to generate a phase difference signal according to the phase difference, and a filter for synchronizing a phase of the clock signal of the voltage controlled generator in response to the phase difference signal, wherein the phase comparator comprises a first D-type flip flop circuit for latching and outputting the input signal with the clock signal as a latch timing, a second D-type flip-flop circuit for latching and outputting the output from the first D-type flip-flop circuit with an inversion of the clock signal as a latch timing, a first logical product gate for outputting a logical product of the input signal and an inverted output from the first D-type flip-flop circuit as a comparison pulse signal, a second logical product gate for outputting a logical product of the output from the first D-type flip-flop circuit and an inverted output from the second D-type flip-flop circuit as a reference pulse signal, and an adder for receiving input of the comparison pulse signal and the reference pulse signal to output the phase difference signal, wherein the phase comparator generates the phase difference signal when a specific pulse waveform of a pulse of the input signal changes.

In the preferred construction, the phase comparator comprises at least one of a first delay circuit for delaying the inverted output of the second D-type flip-flop circuit by an appropriate delay time before the application to the second logical product gate, and a second delay circuit for delaying the output of the first D-type flip-flop circuit by an appropriate delay time before the application to the second logical product gate, thereby setting intervals of the reference pulse signal at an appropriate length.

In another preferred construction, the phase comparator comprises at least one of a third delay circuit for delaying the input signal by an appropriate delay time before the application to the first logical product gate, and a fourth delay circuit for delaying the inverted output of the first D-type flip-flop circuit by an appropriate delay time before the application to the first logical product gate, thereby setting intervals of the comparison pulse signal at an appropriate length.

In another preferred construction, the phase comparator comprises at least one of a first delay circuit for delaying the inverted output of the second D-type flip-flop circuit by an appropriate delay time before the application to the second logical product gate, and a second delay circuit for delaying the output of the first D-type flip-flop circuit by an appropriate delay time before the application to the second logical product gate, thereby setting intervals of the reference pulse signal at an appropriate length, and comprises at least one of:

a third delay circuit for delaying the input signal by an appropriate delay time before the application to the first logical product gate, and a fourth delay circuit for delaying the inverted output of the first D-type flip-flop circuit by an appropriate delay time before the application to the first logical product gate, thereby setting intervals of the comparison pulse signal at an appropriate length.

In another preferred construction, the phase comparator comprises a first D-type flip-flop circuit for latching and outputting the input signal with the clock signal as a latch timing, a second D-type flip-flop circuit for latching and outputting the output from the first D-type flip-flop circuit with an inversion of the clock signal as a latch timing, an inverting circuit for inverting and outputting the input signal, a first logical product gate for outputting a logical product of the inversion of the input signal obtained by the inverting circuit and the output from the first D-type flip-flop circuit as the comparison pulse signal, and a second logical product gate for outputting a logical product of the inverted output from the first D-type flip-flop circuit and the output from the second D-type flip-flop circuit.

According to another aspect of the invention, a clock identification and reproduction circuit which synchronizes a clock signal with an input signal, comprises a voltage controlled generator for generating the clock signal, a phase comparator for detecting a phase difference between the input signal and the clock signal to generate a phase difference signal according to the phase difference, and a filter for synchronizing a phase of the clock signal of the voltage controlled generator in response to the phase difference signal, wherein
the phase comparator comprises
a first D-type flip-flop circuit for latching and outputting the input signal with the clock signal as a latch timing,
a second D-type flip-flop circuit for latching and outputting the output from the first D-type flip-flop circuit with an inversion of the clock signal as a latch timing,
a first logical product gate for outputting a logical product of an inversion of the input signal obtained by the inverting circuit and the output from the first D-type flip-flop circuit as the comparison pulse signal,
a second logical product gate for outputting a logical product of an inverted output from the first D-type flip-flop circuit and the output from the second D-type flip-flop circuit, and
an adder for receiving input of the comparison pulse signal and the reference pulse signal to output the phase difference signal,
the phase comparator generates the phase difference signal when a specific pulse waveform of a pulse of the input signal changes.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
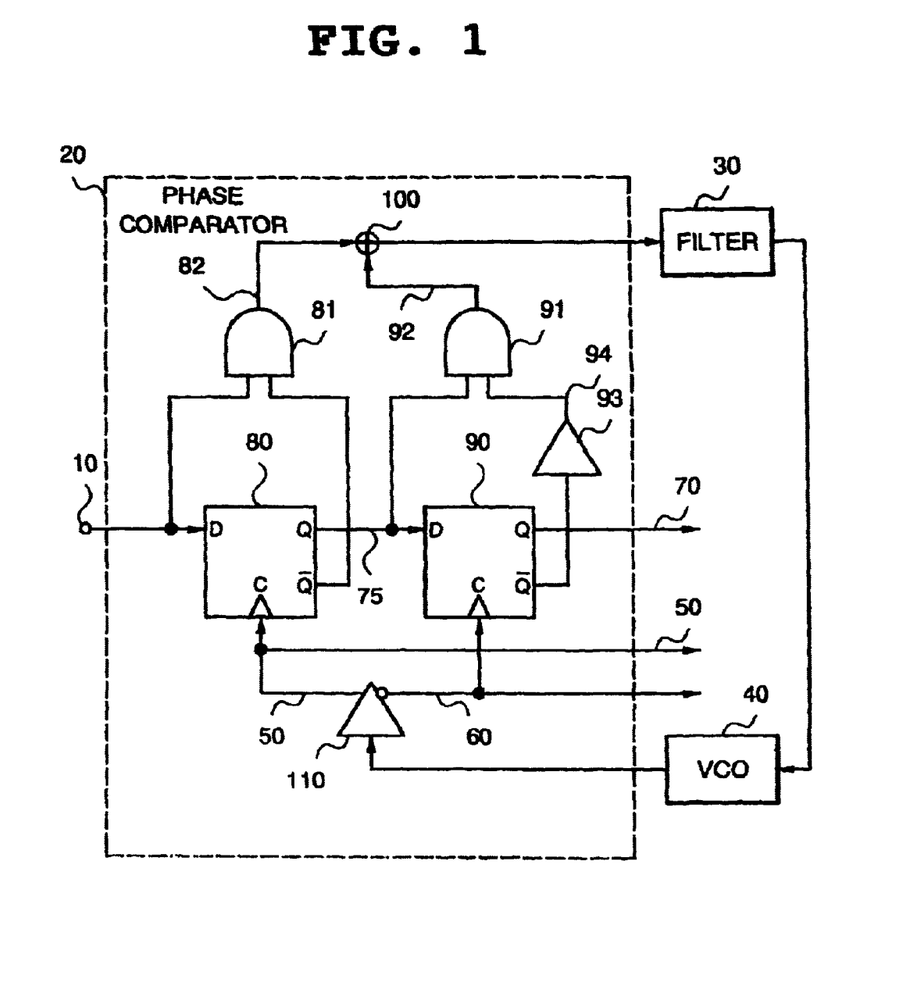
FIG. 1 is a block diagram showing circuit structure of a clock identification and reproduction circuit according to a first embodiment of the present invention.
Figure 2:
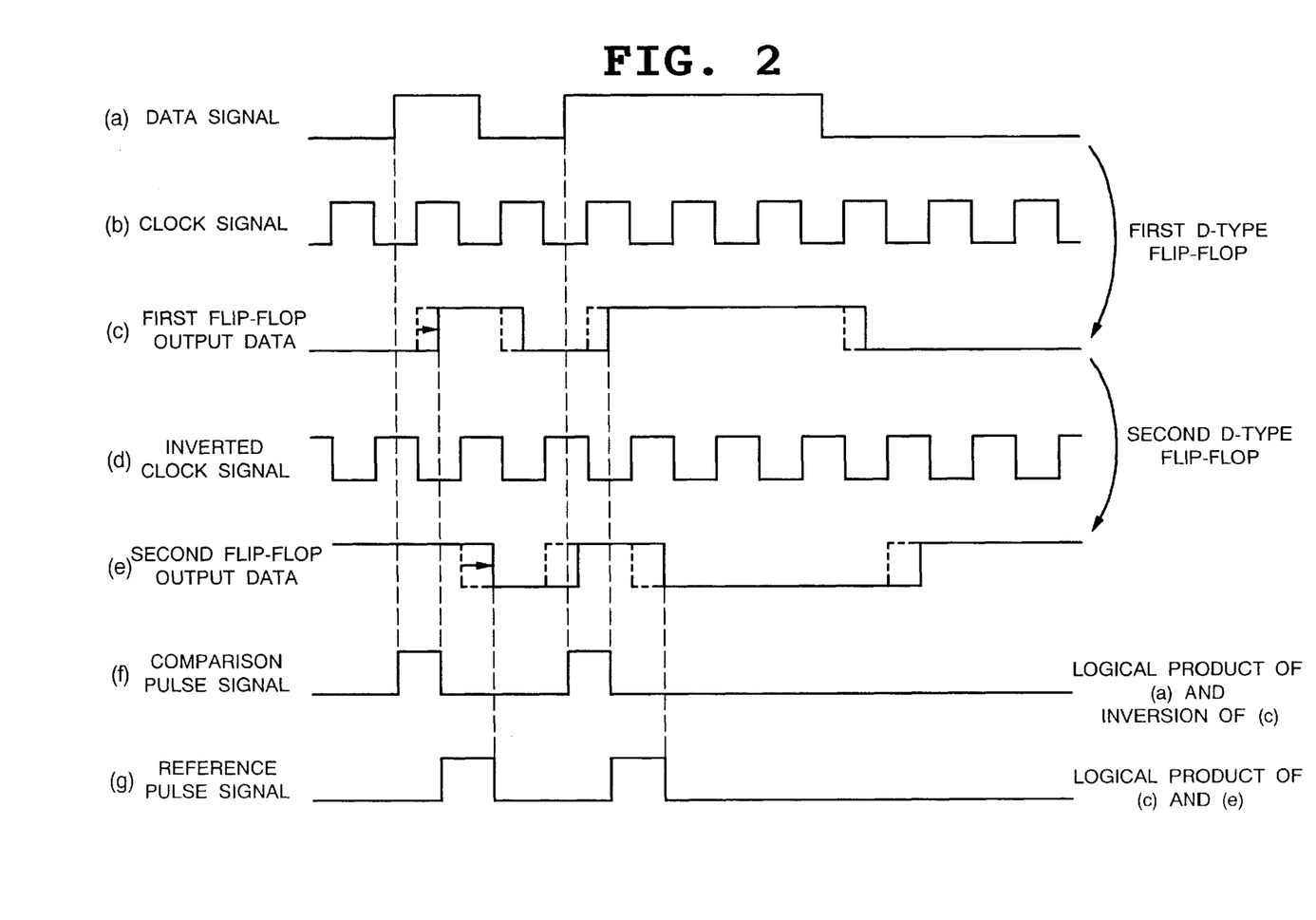
FIG. 2 is a timing chart for use in explaining processing with respect to each signal of the clock identification and reproduction circuit according to the first embodiment of the present invention at a state where a phase of a clock signal lags behind that of a data signal.
Figure 3:
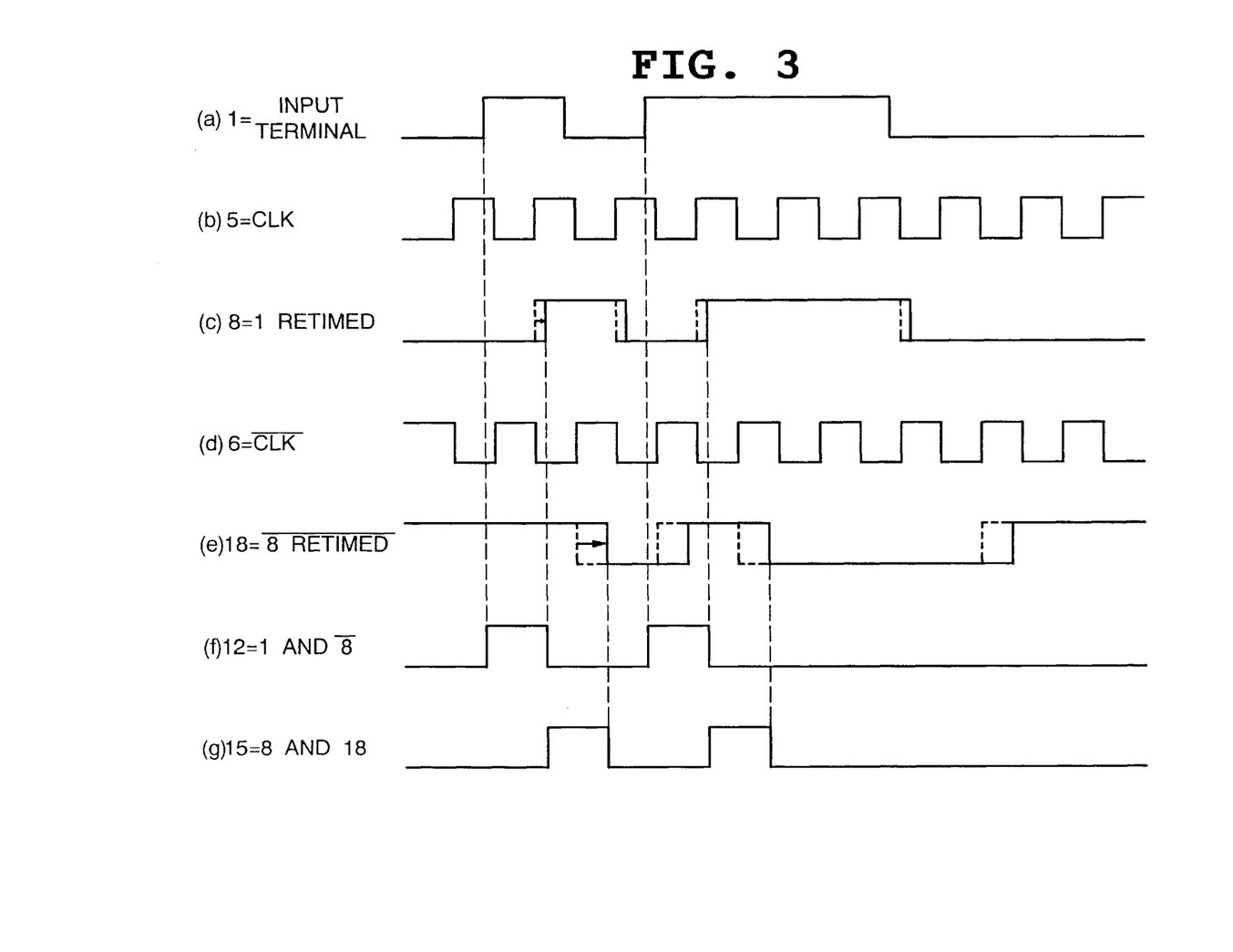
FIG. 3 is a timing chart for use in explaining processing with respect to each signal of the clock identification and reproduction circuit according to the first embodiment of the present invention at a state where a phase of a clock signal leads over that of a data signal.

FIG. 1 is a block diagram showing circuit structure of a clock identification and reproduction circuit according to a first embodiment of the present invention, while FIGS. 2 and 3 are timing charts for use in explaining processing with respect to each signal of the clock identification and reproduction circuit in the present embodiment.

The clock identification and reproduction circuit of the present invention also includes a phase comparator 20, a filter 30 for controlling a loop time constant and a VCO 40 for generating a clock signal. A data signal applied through an input terminal 10 is input to the phase comparator 20 and its phase difference from that of a clock signal from the VCO 40 is quantitatively discriminated. After a high-frequency component contained in the phase difference signal is removed by the filter 30, the signal is fed back as a voltage for controlling a clock signal to the VCO 40. As a result, a clock signal synchronizing with the data signal is obtained from a clock output terminal 50.

Next, the phase comparator 20 of this clock identification and reproduction circuit will be described with reference to FIG. 1.

The phase comparator 20 includes first and second D-type flip-flops 80 and 90, first and second logical product gates 81 and 91, a first delay circuit 93, a clock buffer 110 and an adder 100.

The input terminal 10 is connected to a data input terminal of the first D-type flip-flop 80 and a first D-type flip-flop output terminal 75 is connected to data input terminal of the second D-type flip-flop 90.

In addition, the input terminal 10 and an inverted data output terminal of the first D-type flip-flop 80 are connected to two input terminals of the first logical product gate 81, respectively.

An inverted data output terminal of the second D-type flip-flop 90 is input to the first delay circuit 93, and the input terminal of the second D-type flip-flop 90 and an output terminal 94 of the first delay circuit 93 are connected to two input terminals of the second logical product gate 91, respectively.

As to each clock output terminal, a clock output terminal 50 is connected to a clock input terminal of the first D-type flip-flop 80, an inverted clock output terminal 60 is connected to a clock input terminal of the second D-type flip-flop 90 through the clock buffer 110.

A first logical product gate output terminal 82 and a second logical product gate output terminal 92 are both connected to an input terminal of the adder 100. An output terminal of the adder 100 is connected to the filter 30.

Furthermore, an output terminal of the filter 30 is connected to an oscillation frequency controlling terminal of the VCO 40.

Next, operation of the present invention will be described with reference to the timing charts of FIGS. 2 and 3.

First, in FIG. 2, a data signal (a) applied through the input terminal 10 is output as output data (c) from the output terminal 75 of the first D-type flip-flop 80, with a clock signal (b) from the VCO 40 as a latch timing.

At this time, an internal delay of the first D-type flip-flop 80 is taken into consideration.

The inverted data output of the first D-type flip-flop 80 and the data signal applied through the input terminal 10 are input to the first logical product gate 81 to output a logical product data signal (f) from the output terminal 82. This signal will be used as a comparison pulse signal for making a comparison of phases.

Next, an output of the first D-type flip-flop 80 is input to the data input of the second D-type flip-flop 90 to output a data output to the data output terminal 70, with an inverted clock output signal (d) as a latch timing.

On the other hand, the inverted data output of the second D-type flip-flop 90 is applied to the first delay circuit 93 and output, as inverted data (e), to the first delay circuit output terminal 94.

The inverted data (e) and the output data (c) of the first D-type flip-flop output terminal 75 are applied to the second logical product gate 91 to output a logical product data signal (g) from the second logical product gate output terminal 92.

Since the logical product data signal (g) is a data signal which has been once latched-output and then again latched-output, its pulse width will be constant irrespective of a difference in phase between the clock signal and the data signal. This will be used as a reference pulse signal.

Then, for quantitatively detecting a comparison pulse signal width, the reference pulse signal and the comparison pulse signal are applied to the adder 100 and high-frequency components of the signals are removed by the filter 30 to take out a voltage signal according to a phase difference.

Such a feedback circuit obtains a clock signal of the VCO 40 synchronizing with a data signal.

FIG. 2 shows an operation state where a phase of a clock signal leads over a phase of an input data signal. On the other hand, FIG. 3 shows an operation state where a phase of the clock signal lags behind a phase of the input data signal.

In the present invention, since a logical product gate is used as a circuit for obtaining a comparison pulse signal and a reference pulse signal, these pulse signals are generated only at a rise or a fall of a clock signal, whereby a pulse generation cycle will become longer to attenuate response characteristics of a comparison pulse signal generation circuit and even when a pulse signal width is increased, there is no possibility of waveform interference.

Therefore, a highly reliable clock identification and reproduction circuit can be realized.

Although when a delay time of the first D-type flip-flop 80 is not negligible, a width of a comparison pulse signal will be larger than an ideal width as illustrated in FIGS. 2 and 3, in such a case, by setting a delay time of the first delay circuit 93 at an appropriate length, a width of a reference pulse signal can be appropriately set to enable a latch timing to be precisely set.

Simulation finds that when a transmission rate of a data signal is 10 Gb/s, an error rate of the present invention is reduced by about 20% as compared with that of a conventional circuit.

The present invention therefore is very effective as a clock identification and reproduction circuit for high-speed optical communication.

Figure 4:
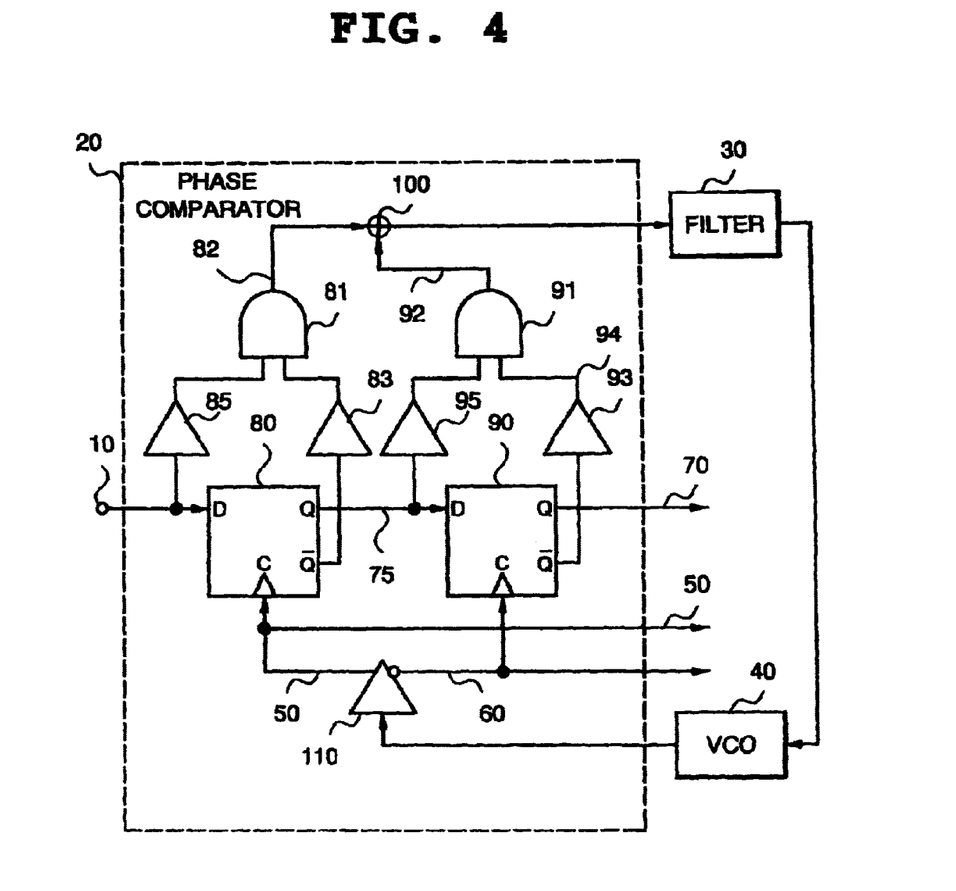
FIG. 4 is a block diagram showing circuit structure of a clock identification and reproduction circuit according to a second embodiment of the present invention.
Figure 5:
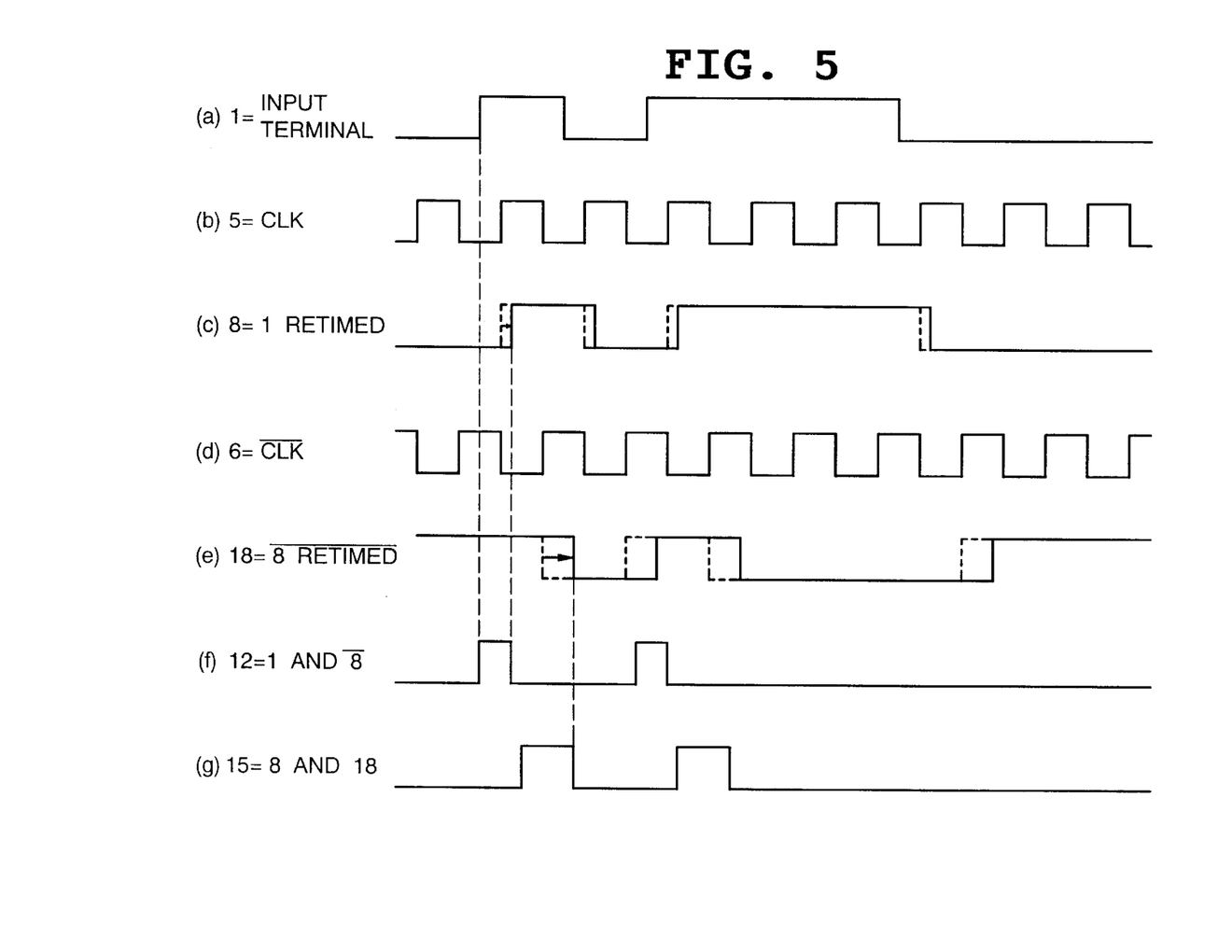
FIG. 5 is a timing chart for use in explaining processing with respect to each signal of the clock identification and reproduction circuit according to the second embodiment of the present invention.

FIG. 4 is a block diagram showing a second embodiment of the clock identification and reproduction circuit according to the present invention and FIG. 5 is a timing chart of each signal in the second embodiment.

The phase comparator of the second embodiment is characterized in making the most of a latch timing margin to make setting of timing more precisely than that in the first embodiment.

In the following, the phase comparator in the second embodiment will be described with reference to FIGS. 4 and 5.

First, an input terminal 10 is connected to a data input terminal of a first D-type flip-flop 80 and a data output terminal 75 of the first D-type flip-flop 80 is connected to a data input terminal of a second D-type flip-flop 90.

The input terminal 10 is also connected to one input terminal of a first logical product gate 81 through a third delay circuit 85 and an inverted data output terminal of the first D-type flip-flop 80 is connected to the other input terminal of the first logical product gate 81 through a fourth delay circuit 83.

Furthermore, the first D-type flip-flop output terminal 75 is connected to one input terminal of a second logical product gate 91 thorough a second delay circuit 95 and an inverted data output terminal of the second D-type flip-flop 90 is connected to the other input terminal of the second logical product gate 91 through a first delay circuit 93.

As described in the first embodiment, since when an internal delay time of the first D-type flip-flop 80 is not negligible, a width of a comparison pulse signal (f) will be larger than an ideal width, the first delay circuit 93 is inserted, taking this fact into consideration, to set a width of a reference pulse signal generated at the second logical product gate output terminal 92 at an appropriate value. However, only with the first delay circuit 93, a subtle phase difference might not be adjusted in some cases.

In the second embodiment of the present invention, therefore, insertion of the second delay circuit 95 enables more precise setting of a latch timing. More specifically, by subtly delaying a phase of a signal applied from the input terminal of the second D-type flip-flop 90 to the second logical product gate 91, a width of the reference pulse signal (g) can be more precisely set.

Furthermore, insertion of the third delay circuit 85 between the input terminal 10 and the first logical product gate 81 and the fourth delay circuit 83 between the first D-type flip-flop 80 and the first logical product gate 81 enables a phase of a signal applied from the input terminal 10 to the first logical product gate 81 to be delayed intentionally, thereby subtly changing a width of the comparison pulse signal (f) to have a value relative to a width of the reference pulse signal.

According to the second embodiment of the present invention, as can be seen from the waveforms (f) and (g) of the timing chart shown in FIG. 5, insertion of the second delay circuit 95 enables subtle setting of a width of a reference pulse signal and insertion of the third delay circuit 85 and the fourth delay circuit 83 enables subtle setting of a width of a comparison pulse signal, resulting in realizing setting of more precise latch timing.

Figure 6:
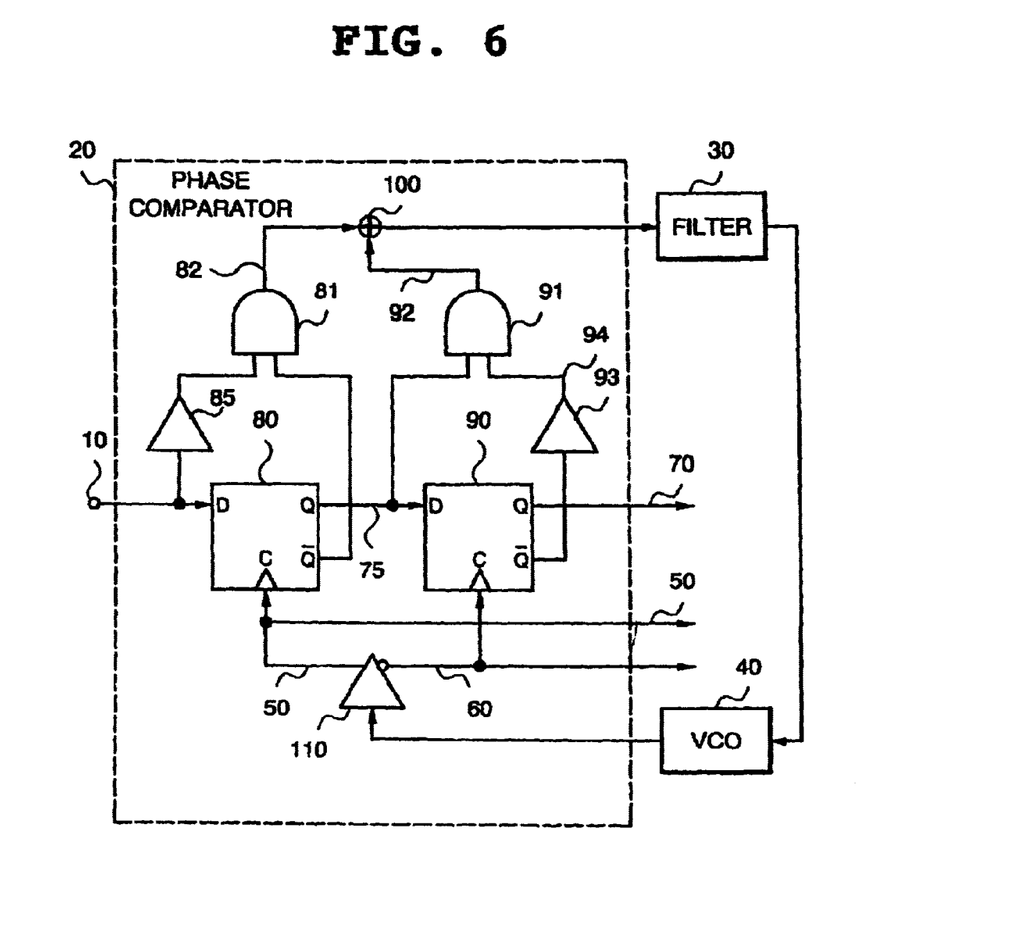
FIG. 6 is a block diagram showing circuit structure of an embodiment of the clock identification and reproduction circuit according to the present invention which includes two delay circuits.
Figure 7:
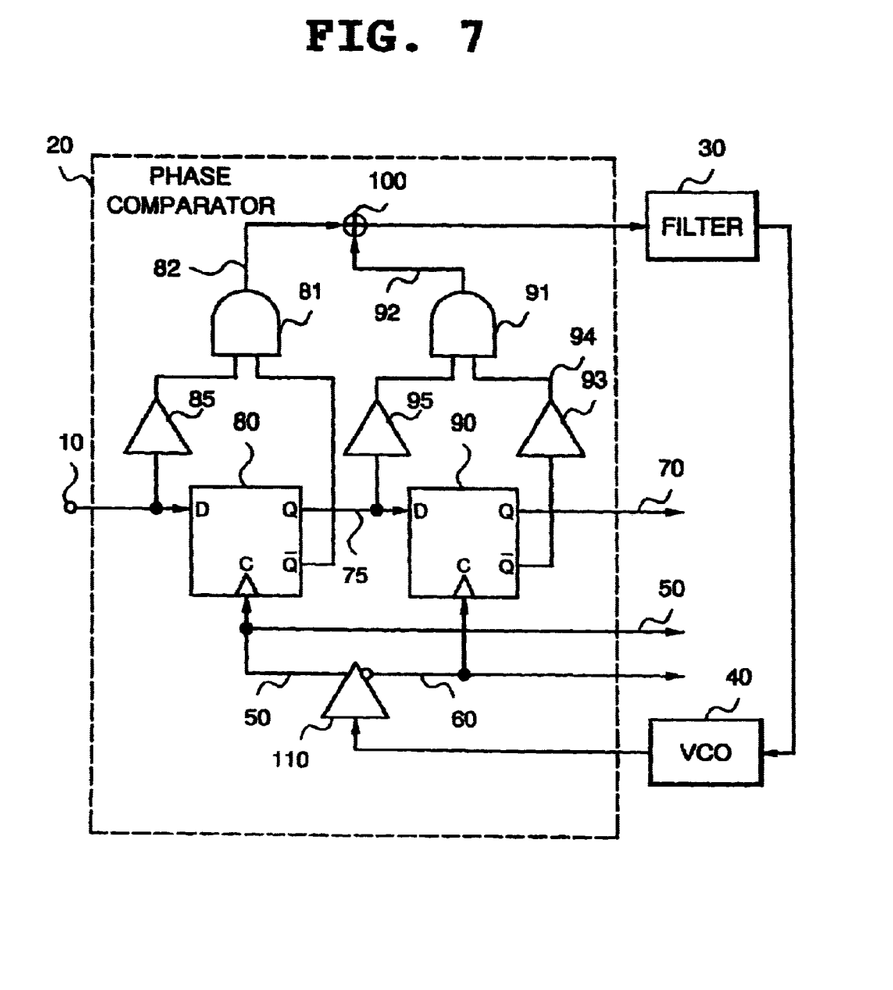
FIG. 7 is a block diagram showing circuit structure of an embodiment of the clock identification and reproduction circuit according to the present invention which includes three delay circuits.

Not all of the first to the fourth delay circuits should be connected. Any one of or a combination of arbitrary two of the three delay circuits or a combination of arbitrary three may be used. FIG. 6 is a block diagram showing an embodiment in which two delay terminals are provided, while FIG. 7 is a block diagram showing an embodiment in which three delay terminals are provided.

In addition, each delay circuit needs to have its design changed appropriately to change a delay time according to a kind (bipolar transistor, MOSFET, etc.) and performance of a transistor used as a circuit element or circuit layout.

While both in the above-described first and second embodiments, a phase control signal is generated when an input signal changes from "0" to "1", generation of a phase control signal when the input signal changes from "1" to "0" can be realized by changing signals to be applied to the first logical product gate and the second logical product gate to be inversions of the signals. For this purpose, of the signals applied to the respective logical gates, a signal as an output of each flip-flop requires no further circuit because the output and the inversion of the output can be obtained from the same flip-flop, while as to an input signal from the input terminal 10, an inverting circuit 88 should be provided to apply an inversion of the signal to the first logical product gate 81 as illustrated in FIG. 8.

Figure 8:
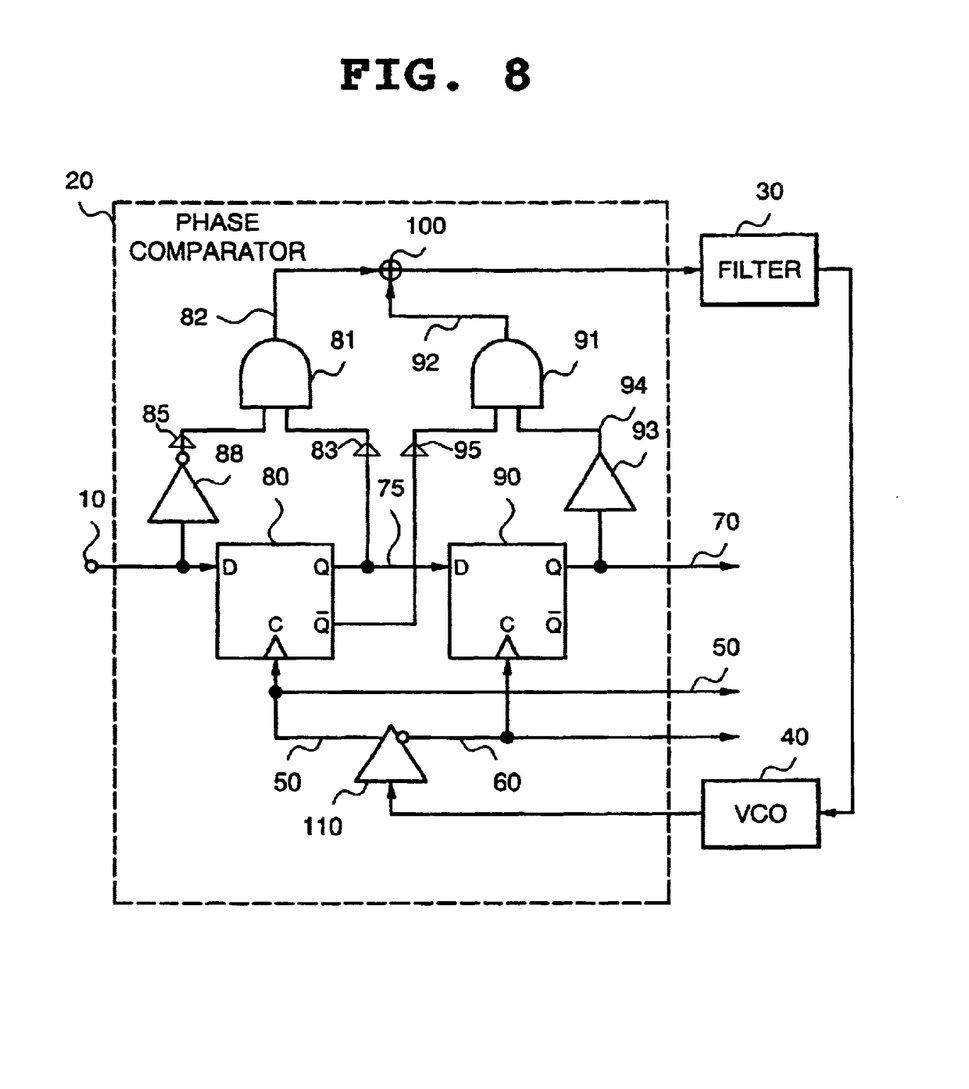
FIG. 8 is a block diagram showing circuit structure of an embodiment of the clock identification and reproduction circuit according to the present invention which generates a phase control signal when an input signal changes from "1" to "0"

Further, as shown in FIG. 8, delay circuits 85, 83, 95 and 93 can also be added to the outputs of the inverting circuit 88 and the D-type flip-flops 80 and 90. The delay circuits can be configured such that any one of or any two of any three of or all of the four delay circuits may be added to the phase comparator 20.

Although the second embodiment of the present invention has circuit structure a little more complicated than that of the first embodiment, a latch timing can be selected within a considerably wide range to increase the flexibility of design and enable more precise setting of a latch timing.

Since the present invention obtains a comparison pulse signal and a reference pulse signal using a logical product gate, it is possible to output the pulse signal only at a rise or a fall of a clock signal to enable a latch timing to be set within a wide range of a data signal.

In addition, since a data signal is applied to a logical product gate through a delay circuit, at the detection of a difference in phase between the data signal and a clock signal, even when a response speed of an internal circuit is not high enough and a width of a comparison pulse signal becomes larger than an ideal width, appropriate setting of an internal delay time of a delay circuit allows more precise setting of a latch timing to enable accurate clock identification and reproduction with respect to a high-speed data signal.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A clock identification and reproduction circuit which synchronizes a clock signal with an input signal, comprising:

a voltage controlled generator for generating said clock signal;

a phase comparator for detecting a phase difference between said input signal and said clock signal to generate a phase difference signal according to the phase difference;

a filter for synchronizing a phase of the clock signal of said voltage controlled generator in response to said phase difference signal, wherein
said phase comparator comprises:
a first D-type flip flop circuit for latching and outputting said input signal using said clock signal for latch timing;
a second D-type flip-flop circuit for latching and outputting the output from said first D-type flip-flop circuit using an inversion of said clock signal for latch timing;
a first logical product gate for outputting a logical product of said input signal and an inverted output from said first D-type flip-flop circuit as a comparison pulse signal;
a second logical product gate for outputting a logical product of the output from said first D-type flip-flop circuit and an inverted output from said second D-type flip-flop circuit as a reference pulse signal;
an adder for receiving inputs of said comparison pulse signal and said reference pulse signal to output said phase difference signal, wherein said phase comparator generates the phase difference signal when a specific pulse waveform of a pulse of said input signal changes;
wherein said phase comparator comprises at least one of:
a first delay circuit for delaying the inverted output of said second D-type flip-flop circuit by a first delay time before application to said second logical product gate, and a second delay circuit for delaying the output of said first D-type flip-flop circuit by a second delay time before application to said second logical product gate, thereby setting intervals of said reference pulse signal.

2. A clock identification and reproduction circuit which synchronizes a clock signal with an input signal, comprising:

a voltage controlled generator for generating said clock signal;

a phase comparator for detecting a phase difference between said input signal and said clock signal to generate a phase difference signal according to the phase difference;

a filter for synchronizing a phase of the clock signal of said voltage controlled generator in response to said phase difference signal, wherein said phase comparator comprises:

a first D-type flip flop circuit for latching and outputting said input signal using said clock signal for latch timing;

a second D-type flip-flop circuit for latching and outputting the output from said first D-type flip-flop circuit using an inversion of said clock signal for latch timing;

a first logical product gate for outputting a logical product of said input signal and an inverted output from said first D-type flip-flop circuit as a comparison pulse signal;

a second logical product gate for outputting a logical product of the output from said first D-type flip-flop circuit and an inverted output from said second D-type flip-flop circuit as a reference pulse signal;

an adder for receiving inputs of said comparison pulse signal and said reference pulse signal to output said phase difference signal, wherein said phase comparator generates the phase difference signal when a specific pulse waveform of a pulse of said input signal changes;

wherein said phase comparator comprises at least one of:

a first delay circuit for delaying said input signal by a first delay time before application to said first logical product gate, and a second delay circuit for delaying the inverted output of said first D-type flip-flop circuit by a second delay time before application to said first logical product gate, thereby setting intervals of said comparison pulse signal.

3. A clock identification and reproduction circuit which synchronizes a clock signal with an input signal, comprising:

a voltage controlled generator for generating said clock signal;

a phase comparator for detecting a phase difference between said input signal and said clock signal to generate a phase difference signal according to the phase difference;

a filter for synchronizing a phase of the clock signal of said voltage controlled generator in response to said phase difference signal; wherein said phase comparator comprises:

a first D-type flip flop circuit for latching and outputting said input signal using said clock signal for latch timing;

a second D-type flip-flop circuit for latching and outputting the output from said first D-type flip-flop circuit using an inversion of said clock signal for latch timing;

a first logical product gate for outputting a logical product of said input signal and an inverted output from said first D-type flip-flop circuit as a comparison pulse signal;

a second logical product gate for outputting a logical product of the output from said first D-type flip-flop circuit and an inverted output from said second D-type flip-flop circuit as a reference pulse signal;

an adder for receiving inputs of said comparison pulse signal and said reference pulse signal to output said phase difference signal, wherein said phase comparator generates the phase difference signal when a specific pulse waveform of a pulse of said input signal changes, wherein said phase comparator comprises at least one of:

a first delay circuit for delaying the inverted output of said second D-type flip-flop circuit by a first delay time before application to said second logical product gate, a second delay circuit for delaying the output of said first D-type flip-flop circuit by a second delay time before application to said second logical product gate, thereby setting intervals of said reference pulse signal, and comprises at least one of:

a third delay circuit for delaying said input signal by a third delay time before application to said first logical product gate; and a fourth delay circuit for delaying the inverted output of said first D-type flip-flop circuit by a fourth delay time before application to said first logical product gate, thereby setting intervals of said comparison pulse signal.

4. A clock identification and reproduction circuit which synchronizes a clock signal with an input signal, comprising:

a voltage controlled generator for generating said clock signal;

a phase comparator for detecting a phase difference between said input signal and said clock signal to generate a phase difference signal;

a filter for synchronizing a phase of the clock signal of said voltage controlled generator in response to said phase difference signal, wherein said phase comparator comprises:

a first D-type flip-flop circuit for latching and outputting said input signal using said clock signal for latch timing;

a second D-type flip-flop circuit for latching and outputting the output from said first D-type flip-flop circuit using an inversion of said clock signal for latch timing;

a first logical product gate for outputting a logical product of an inversion of said input signal obtained by an inverting circuit and the output from said first D-type flip-flop circuit as a comparison pulse signal;

a second logical product gate for outputting a logical product of an inverted output from said first D-type flip-flop circuit and the output from said second D-type flip-flop circuit as a reference pulse signal; and an adder for receiving inputs of said comparison pulse signal and said reference pulse signal to output said phase difference signal, wherein said phase comparator generates the phase difference signal when a specific pulse waveform of a pulse of said input signal changes.

5. The clock identification and reproduction circuit as set forth in claim 4, wherein said phase comparator comprises at least one of:

a first delay circuit for delaying the output of said second D-type flip-flop circuit by a first delay time before application to said second logical product gate, and a second delay circuit for delaying the inverted output of said first D-type flip-flop circuit by a second delay time before application to said second logical product gate, thereby setting intervals of said reference pulse signal.

6. The clock identification and reproduction circuit as set forth in claim 4, wherein said phase comparator comprises at least one of:

a first delay circuit for delaying the inversion of said input signal obtained by said inverting circuit by a first delay time before application to said first logical product gate, and a second delay circuit for delaying the output of said first D-type flip-flop circuit by a second delay time before application to said first logical product gate, thereby setting intervals of said comparison pulse signal.

7. The clock identification and reproduction circuit as set forth in claim 4, wherein said phase comparator comprises at least one of:

a first delay circuit for delaying the output of said second D-type flip-flop circuit by a first delay time before application to said second logical product gate;

a second delay circuit for delaying the inverted output of said first D-type flip-flop circuit by a second delay time before application to said second logical product gate, thereby setting intervals of said reference pulse signal, and comprises at least one of:

a third delay circuit for delaying the inversion of said input signal obtained by said inverting circuit by a third delay time before application to said first logical product gate; and a fourth delay circuit for delaying the output of said first D-type flip-flop circuit by a fourth delay time before application to said first logical product gate, thereby setting intervals of said comparison pulse signal.

\* \* \* \* \*